(12) United States Patent
Hirabayashi et al.

(10) Patent No.: US 9,620,499 B2
(45) Date of Patent: Apr. 11, 2017

(54) SEMICONDUCTOR DEVICE AND METHOD OF MANUFACTURING THE SEMICONDUCTOR DEVICE

(71) Applicant: TOYOTA JIDOSHA KABUSHIKI KAISHA, Toyota-shi, Aichi-ken (JP)

(72) Inventors: Yasuhiro Hirabayashi, Toyota (JP); Satoru Machida, Nagakute (JP); Yusuke Yamashita, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/119,420

(22) PCT Filed: Feb. 27, 2015

(86) PCT No.: PCT/JP2015/055954
§ 371 (c)(1),
(2) Date: Aug. 17, 2016

(87) PCT Pub. No.: WO2015/166703
PCT Pub. Date: Nov. 5, 2015

(65) Prior Publication Data
US 2017/0069625 A1    Mar. 9, 2017

(30) Foreign Application Priority Data

Apr. 28, 2014 (JP) ................. 2014-092438

(51) Int. Cl.
*H01L 29/739* (2006.01)
*H01L 27/06* (2006.01)
(Continued)

(52) U.S. Cl.
CPC .... *H01L 27/0664* (2013.01); *H01L 21/26513* (2013.01); *H01L 29/04* (2013.01);
(Continued)

(58) Field of Classification Search
CPC . H01L 27/0664; H01L 29/7397; H01L 29/32; H01L 29/36; H01L 29/1095;
(Continued)

(56) References Cited

U.S. PATENT DOCUMENTS 8,299,496 B2 * 10/2012 Nagaoka ............... H01L 21/761
257/133
8,330,185 B2 * 12/2012 Soeno ................. H01L 27/0664
257/133
(Continued)

FOREIGN PATENT DOCUMENTS

JP    2005-197472 A    7/2005
JP    2007-184486 A    7/2007
(Continued)

*Primary Examiner* — Michael Trinh
(74) *Attorney, Agent, or Firm* — Oliff PLC

(57) ABSTRACT

A semiconductor device for restraining snapback is provided. The semiconductor device includes IGBT and diode regions. In a view of n-type impurity concentration distribution along a direction from a front surface to a rear surface, a local minimum value of an n-type impurity concentration is located at a border between cathode and buffer regions. A local maximum value of n-type impurity concentration is located in the buffer region. At least one of the buffer and cathode regions includes a crystal defect region having crystal defects in a higher concentration than a region therearound. A peak of a crystal defect concentration in a view of crystal defect concentration distribution along the direction from the front surface to the rear surface is located in a region on the rear surface side with respect to a specific position having the n-type impurity concentration which is a half of the local maximum value.

4 Claims, 12 Drawing Sheets

(51) Int. Cl.
*H01L 29/868* (2006.01)
*H01L 29/10* (2006.01)
*H01L 21/265* (2006.01)
*H01L 29/04* (2006.01)
*H01L 29/32* (2006.01)
*H01L 29/66* (2006.01)
*H01L 29/36* (2006.01)

(52) U.S. Cl.
CPC .......... *H01L 29/1095* (2013.01); *H01L 29/32* (2013.01); *H01L 29/36* (2013.01); *H01L 29/66348* (2013.01); *H01L 29/7397* (2013.01); *H01L 29/868* (2013.01); *H01L 2924/13055* (2013.01)

(58) Field of Classification Search
CPC ............. H01L 29/66348; H01L 29/861; H01L 29/66136; H01L 29/868; H01L 21/26513; H01L 21/2652; H01L 21/26506; H01L 2924/13055
See application file for complete search history.

(56) References Cited

U.S. PATENT DOCUMENTS

| | | | |
|---|---|---|---|
| 9,064,711 B2* | 6/2015 | Senoo | H01L 29/0834 |
| 9,349,827 B2* | 5/2016 | Matsuura | H01L 29/36 |
| 2007/0158680 A1 | 7/2007 | Ozeki et al. | |
| 2008/0315248 A1 | 12/2008 | Tokura et al. | |
| 2009/0242931 A1* | 10/2009 | Tsuzuki | H01L 29/167 257/143 |
| 2013/0075784 A1* | 3/2013 | Ikeda | H01L 27/0727 257/140 |
| 2015/0206758 A1 | 7/2015 | Kato et al. | |

FOREIGN PATENT DOCUMENTS

| | | |
|---|---|---|
| JP | 2007-288158 A | 11/2007 |
| JP | 2011-134861 A | 7/2011 |
| JP | 2015-138801 A | 7/2015 |

* cited by examiner

SEMICONDUCTOR DEVICE AND METHOD OF MANUFACTURING THE SEMICONDUCTOR DEVICE

TECHNICAL FIELD

Cross-Reference to Related Application

The present application is related to, and claims priority based on, Japanese Patent Application No. 2014-092438 filed on Apr. 28, 2014, the entire contents of which are hereby incorporated by reference as components of the present specification.

The present invention relates to a semiconductor device.

BACKGROUND ART

Japanese Patent Application Publication No. 2007-288158 (hereinafter referred to as Patent Literature 1) discloses a semiconductor device that has a diode and an IGBT (a so-called RC-IGBT). In this semiconductor device, a buffer region that has a relatively high n-type impurity concentration is provided between a cathode region and a drift region in the diode. When the diode is off, the buffer region prevents a depletion layer from extending over to the cathode region.

SUMMARY OF INVENTION

Technical Problem

As described in Patent Literature 1, in a semiconductor device where a diode and an IGBT are provided in the same semiconductor substrate, electrons flow from a drift layer in the IGBT into the buffer region in the diode when the IGBT is turned on. Accordingly, when the IGBT is turned on, a voltage between an emitter and a collector temporarily rises, and then a current that flows in the IGBT increases. Such a characteristic is referred to as snapback. When the IGBT exhibits snapback, losses in the IGBT increase, which is problematic. In the art in Patent Literature 1, the occurrence of snapback is suppressed by adjusting a resistivity, a thickness, and a width of respective semiconductor layers to have a prescribed relation. However, the resistivity, the thickness, and the width of the respective semiconductor layers exert a significant influence also on other characteristics of the semiconductor device. Accordingly, if constraints are imposed on the resistivity, the thickness, and the width of the semiconductor layers as in Patent Literature 1, there had been a problem that the characteristics of the semiconductor device cannot be optimized.

Solution to Technical Problem

A semiconductor device of the present invention comprises a semiconductor substrate comprising an IGBT region and a diode region. An emitter electrode is provided on a front surface of the semiconductor substrate in the IGBT region. An anode electrode is provided on the front surface of the semiconductor substrate in the diode region. A rear electrode is provided on a rear surface of the semiconductor substrate. The IGBT region comprises an emitter region of an n-type and in contact with the emitter electrode; a body region of a p-type and in contact with the emitter electrode; an IGBT drift region of the n-type and separated from the emitter region by the body region; a collector region of the p-type, separated from the body region by the IGBT drift region, and in contact with the rear electrode; a gate insulating film in contact with the body region; and a gate electrode facing the body region via the gate insulating film. The diode region comprises an anode region of the p-type and in contact with the anode electrode; a diode drift region of the n-type, bordering the anode region on a rear surface side, and connected to the IGBT drift region; a buffer region of the n-type and bordering the diode drift region on the rear surface side; and a cathode region of the n-type, bordering the buffer region on the rear surface side, and in contact with the rear electrode. In a view of n-type impurity concentration distribution along a direction from the front surface to the rear surface, a local minimum value of an n-type impurity concentration is located at a border between the cathode region and the buffer region, and a local maximum value of the n-type impurity concentration is located in the buffer region. A peak value of the n-type impurity concentration in the cathode region and the local maximum value are higher than the n-type impurity concentration in the diode drift region. At least one of the buffer region and the cathode region comprises a crystal defect region in which crystal defects are distributed in a higher concentration than a region around the crystal defect region. A peak value of a crystal defect concentration in the view of crystal defect concentration distribution along the direction from the front surface to the rear surface is located in a region on the rear surface side with respect to a specific position having the n-type impurity concentration which is a half of the local maximum value, the specific position being located on a front surface side with respect to a position of the local maximum value.

In this semiconductor device, at least one of the buffer region and the cathode region includes the crystal defect region such that the peak value of the crystal defect concentration is located in the buffer region or the cathode region. If the crystal defect region is provided as such, electrons are suppressed from flowing from the IGBT drift region to the buffer region or the cathode region when the IGBT is turned on. The snapback is thereby restrained.

DESCRIPTION OF EMBODIMENTS

Initially, some of features of embodiments will hereinafter be listed.
(Feature 1) The peak value of crystal defect concentration is located in the buffer region. Since electrical resistance rises more easily in the buffer region than in the cathode region owing to crystal defects, according to such an aspect, snapback can more suitably be restrained.
(Feature 2) The peak value of the crystal defect concentration is located in a region having an n-type impurity concentration higher than a half of the local maximum value.
(Feature 3) The crystal defect region is formed by implanting charged particles into the semiconductor substrate.

Figure 1:
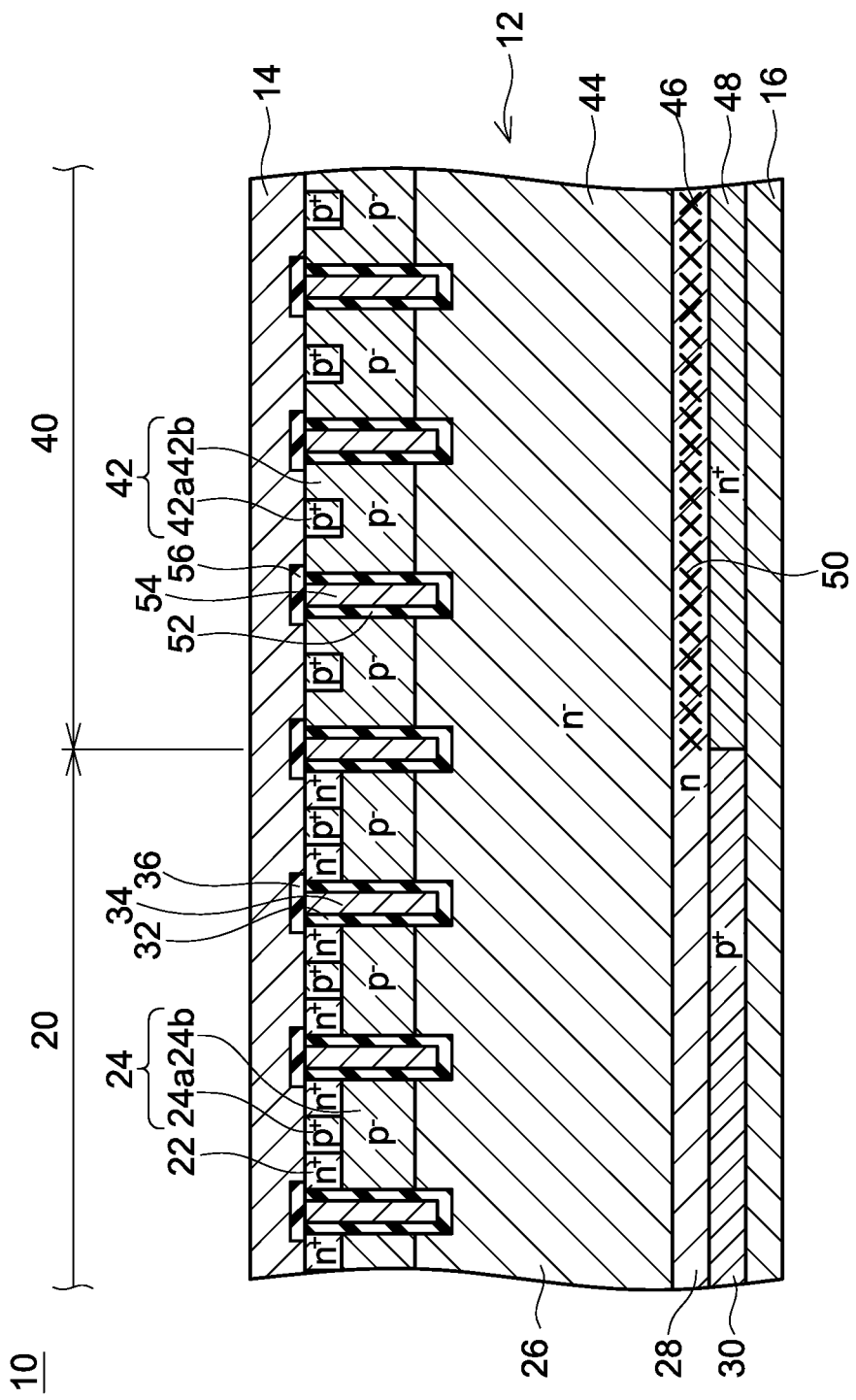
FIG. 1 is a vertical cross-sectional view of a semiconductor device 10 in a first embodiment.

A semiconductor device 10 in a first embodiment shown in FIG. 1 comprises a semiconductor substrate 12, an upper electrode 14, and a lower electrode 16. The semiconductor substrate 12 is a substrate made of silicon. The upper electrode 14 is provided on an upper surface (a front surface) of the semiconductor substrate 12. The lower electrode 16 is provided on a lower surface (a rear surface) of the semiconductor substrate 12.

The semiconductor substrate 12 has an IGBT region 20 where a vertical IGBT is provided, and a diode region 40 where a vertical diode is provided. The upper electrode 14 serves as both of an emitter electrode of the IGBT and an anode electrode of the diode. The lower electrode 16 serves as both of a collector electrode of the IGBT and a cathode electrode of the diode.

Provided in the semiconductor substrate 12 in the IGBT region 20 are emitter regions 22, a body region 24, an IGBT drift region 26, an IGBT buffer region 28, and a collector region 30.

The emitter regions 22 are n-type regions, and provided in a range exposed on the upper surface of the semiconductor substrate 12. The emitter regions 22 are ohmic-connected to the upper electrode 14.

The body region 24 is a p-type region, and in contact with the emitter regions 22. The body region 24 is provided in a range exposed on the upper surface of the semiconductor substrate 12. The body region 24 extends from lateral sides of the emitter regions 22 to undersides of the emitter regions 22. The body region 24 has body contact regions 24a and a low-concentration body region 24b. The body contact regions 24a have a high p-type impurity concentration. The body contact regions 24a are provided in a range exposed on the upper surface of the semiconductor substrate 12, and ohmic-connected to the upper electrode 14. The low-concentration body region 24b has a lower p-type impurity concentration than the body contact regions 24a. The low-concentration body region 24b is provided under the emitter regions 22 and the body contact regions 24a.

The IGBT drift region 26 is an n-type region, and in contact with the body region 24. The IGBT drift region 26 is provided under the body region 24. The IGBT drift region 26 is separated from the emitter regions 22 by the body region 24.

The IGBT buffer region 28 is an n-type region, and in contact with the IGBT drift region 26. The IGBT buffer region 28 is provided under the IGBT drift region 26. The IGBT buffer region 28 has a higher n-type impurity concentration than the IGBT drift region 26.

The collector region 30 is a p-type region, and in contact with the IGBT buffer region 28. The collector region 30 is provided under the IGBT buffer region 28. The collector region 30 is provided in a range exposed on the lower surface of the semiconductor substrate 12. The collector region 30 is ohmic-connected to the lower electrode 16. The collector region 30 is separated from the body region 24 by the IGBT drift region 26 and the IGBT buffer region 28.

Provided in the upper surface of the semiconductor substrate 12 in the IGBT region 20 is a plurality of trenches. Each of the trenches is provided at a position bordering a corresponding one of the emitter regions 22. Each of the trenches extends to such a depth as to reach the IGBT drift region 26.

An inner surface of each of the trenches in the IGBT region 20 is covered with a gate insulating film 32. Moreover, each of the trenches has a gate electrode 34 disposed therein. Each gate electrode 34 is insulated from the semiconductor substrate 12 by the respective gate insulating film 32. Each gate electrode 34 faces the corresponding emitter region 22, the low-concentration body region 24b, and the IGBT drift region 26 via the respective gate insulating film 32. On top of each gate electrode 34, an insulating film 36 is provided. Each gate electrode 34 is insulated from the upper electrode 14 by the respective insulating film 36.

Provided in the semiconductor substrate 12 in the diode region 40 are an anode region 42, a diode drift region 44, a diode buffer region 46, and a cathode region 48.

The anode region 42 is provided in a range exposed on the upper surface of the semiconductor substrate 12. The anode region 42 has anode contact regions 42a and a low-concentration anode region 42b. The anode contact regions 42a have a high p-type impurity concentration. The anode contact regions 42a are provided in a range exposed on the upper surface of the semiconductor substrate 12, and ohmic-connected to the upper electrode 14. The low-concentration anode region 42b has a lower p-type impurity concentration than the anode contact regions 42a. The low-concentration anode region 42b is provided lateral to, and under the anode contact regions 42a.

The diode drift region 44 is an n-type region, and in contact with the anode region 42. The diode drift region 44 is provided under the anode region 42. The diode drift region 44 has an n-type impurity concentration approximately equal to the n-type impurity concentration in the IGBT drift region 26. The diode drift region 44 is connected to the IGBT drift region 26. That is, the diode drift region 44 and the IGBT drift region 26 are connected to each other to constitute substantially one semiconductor region.

The diode buffer region 46 is an n-type region, and in contact with the diode drift region 44. The diode buffer region 46 is provided under the diode drift region 44. The diode buffer region 46 has a higher n-type impurity concentration than the diode drift region 44. The diode buffer region 46 has an n-type impurity concentration approximately equal to the n-type impurity concentration in the IGBT buffer region 28. The diode buffer region 46 is connected to the IGBT buffer region 28. That is, the diode buffer region 46 and the IGBT buffer region 28 are connected to each other to constitute substantially one semiconductor region.

The cathode region 48 is an n-type region, and in contact with the diode buffer region 46. The cathode region 48 is provided under the diode buffer region 46. The cathode region 48 has a higher n-type impurity concentration than the diode drift region 44. The cathode region 48 is provided in a range exposed on the lower surface of the semiconductor substrate 12. The cathode region 48 is ohmic-connected to the lower electrode 16.

Provided in the upper surface of the semiconductor substrate 12 in the diode region 40 is a plurality of trenches. Each of the trenches extends to such a depth as to reach the diode drift region 44.

An inner surface of each of the trenches in the diode region 40 is covered with an insulating film 52. Moreover, each of the trenches has a control electrode 54 disposed therein. Each control electrode 54 is insulated from the semiconductor substrate 12 by the respective insulating film 52. Each control electrode 54 faces the anode region 42 and the diode drift region 44 via the respective insulating film 52. On the top of each control electrode 54, an insulating film 56 is provided. Each control electrode 54 is insulated from the upper electrode 14 by the respective insulating film 56.

Provided in the diode buffer region 46 is a crystal defect region 50. The crystal defect region 50 is a region that has a higher crystal defect concentration than surrounding regions (e.g., the diode drift region 44 and the cathode region 48). Crystal defects in the crystal defect region 50 are formed by implanting charged particles such as helium ions into the semiconductor substrate 12. The crystal defects formed as such inhibit the movement of carriers. Accordingly, the crystal defect region 50 has a high electrical resistance.

Figure 2:
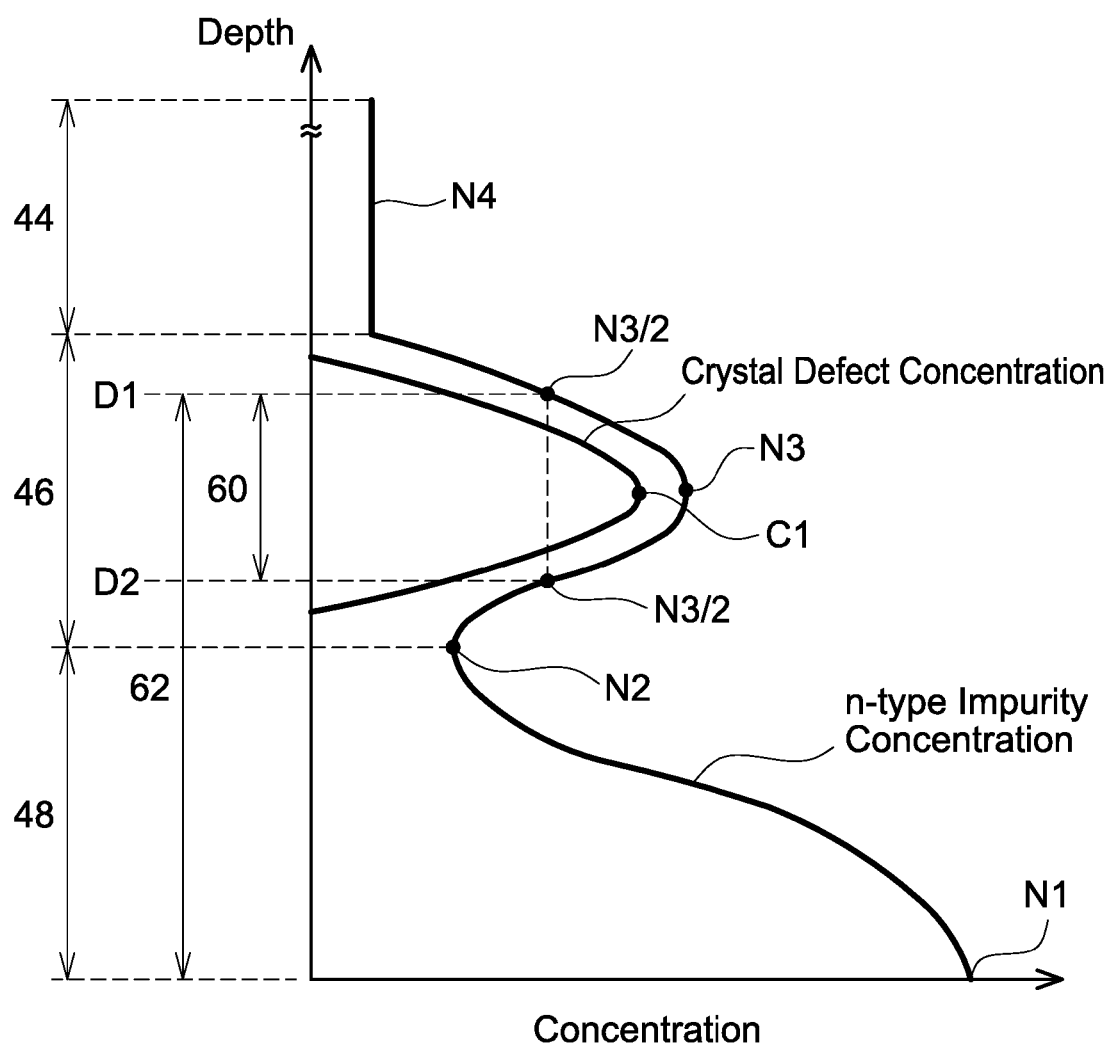
FIG. 2 is a graph that shows n-type impurity concentration distribution and crystal defect concentration distribution in a depth direction of the semiconductor device 10 in the first embodiment.

FIG. 2 shows n-type impurity concentration distribution and crystal defect concentration distribution in the diode region 40 in a depth direction of the semiconductor substrate 12 (a direction from the upper surface toward the lower surface). An axis of ordinates in FIG. 2 shows a position in the depth direction in the semiconductor substrate 12. An axis of abscissas in FIG. 2 logarithmically shows an n-type impurity concentration and a crystal defect concentration. Notably, the n-type impurity concentration and the crystal defect concentration have different ranges.

In the cathode region 48, the n-type impurity concentration takes a peak value N1 at a position of the lower surface of the semiconductor substrate 12. The n-type impurity concentration decreases from the position of the peak value N1 toward an upper surface side, and then takes a local minimum value N2 at a position of a border between the cathode region 48 and the diode buffer region 46. That is, the depth that has the local minimum value N2 is the border between the cathode region 48 and the diode buffer region 46. The n-type impurity concentration increases from the position of the local minimum value N2 toward the upper surface side, and then takes a local maximum value N3 in the diode buffer region 46. The n-type impurity concentration decreases from the position of the local maximum value N3 toward the upper side, and then takes a value N4 at a position of a border between the diode buffer region 46 and the diode drift region 44. In the diode drift region 44, the n-type impurity concentration is kept approximately constant at the value N4. That is, a region where the n-type impurity concentration is distributed at an approximately constant value N4 is the diode drift region 44, and a region that is located on a lower surface side with respect to the diode drift region 44 and has the n-type impurity concentration that is higher than the value N4 is the diode buffer region 46. The local minimum value N2 is higher than the value N4. The local maximum value N3 is higher than the local minimum value N2. The peak value N1 is higher than the local maximum value N3.

Moreover, each of positions D1 and D2 in the depth direction shown in FIG. 2 shows a position having the n-type impurity concentration (N3/2) which is a half of the local maximum value N3 in the diode buffer region 46. The position D1 is located on the upper surface side with respect to the position of the local maximum value N3, while the position D2 is located on the lower surface side with respect to the position of the local maximum value N3. Moreover, a region 60 in FIG. 2 shows a region between the positions D1 and D2. In the region 60, the n-type impurity concentration is higher than the value which is a half of the local maximum value N3.

Moreover, as shown in FIG. 2, a peak value C1 of the crystal defect concentration is located in the diode buffer region 46. More specifically, the peak value C1 of the crystal defect concentration is located in the region 60.

Figure 3:
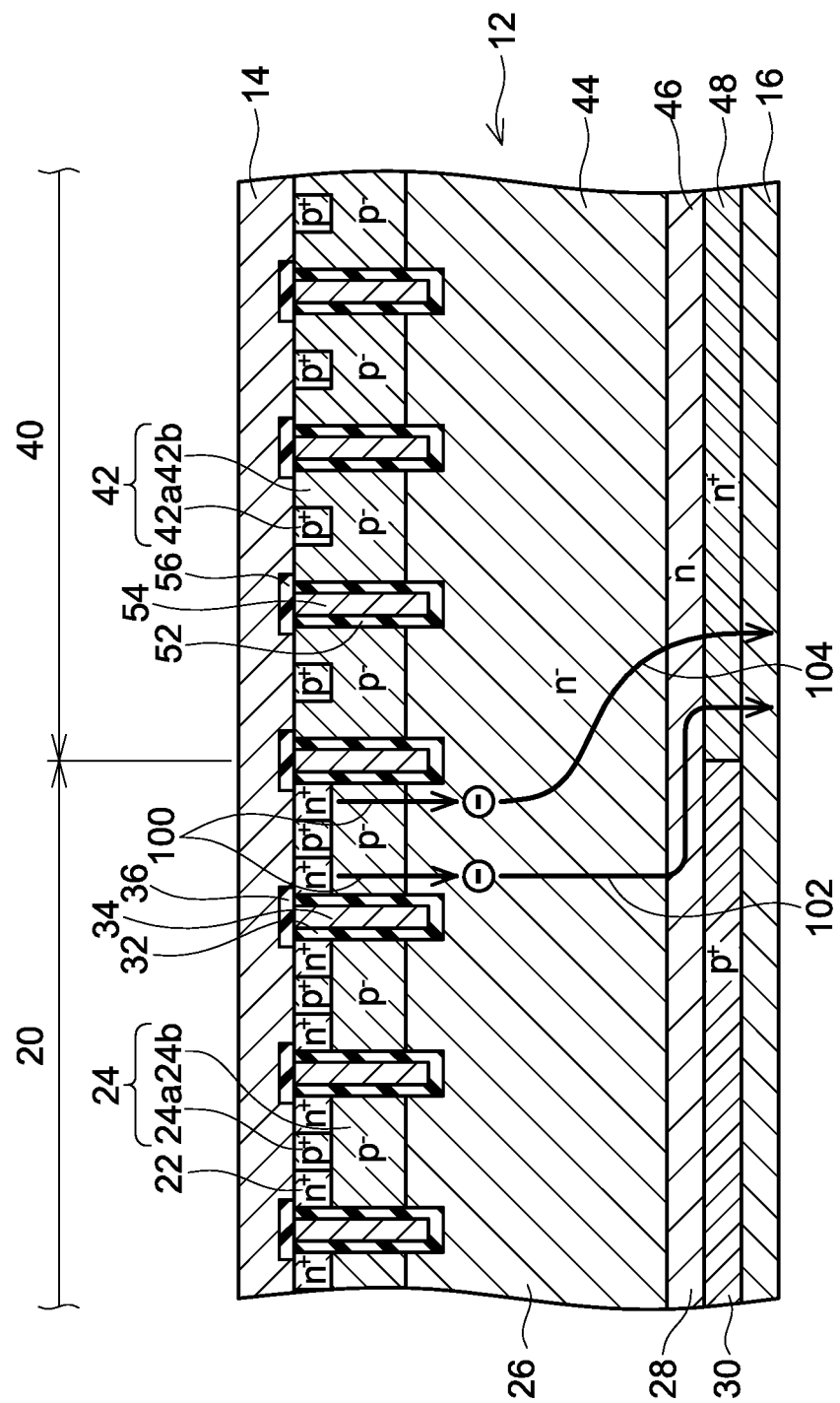
FIG. 3 is a vertical cross-sectional view of a semiconductor device in a comparative example.
Figure 4:
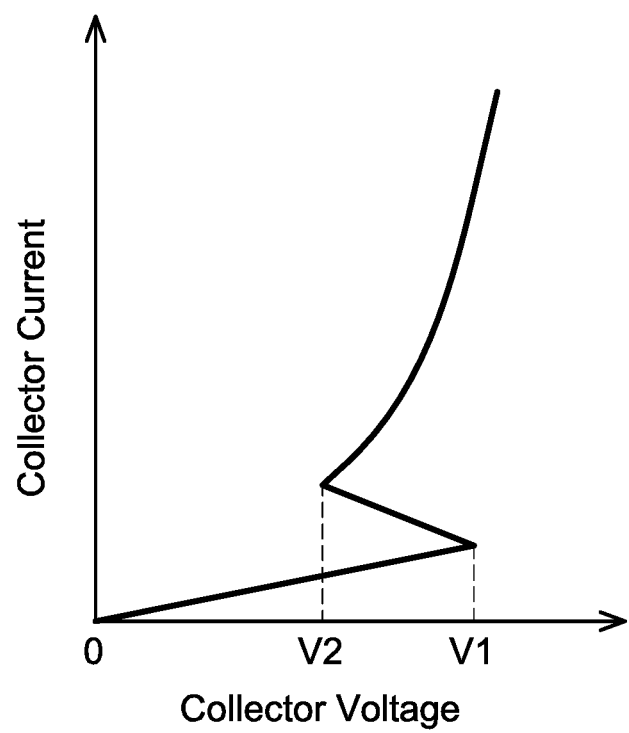
FIG. 4 is a graph that shows characteristics of an IGBT in the semiconductor device in FIG. 3.

Next, an operation of the semiconductor device 10 in the first embodiment will be described in comparison with an operation of a semiconductor device in a comparative example. FIG. 3 shows the semiconductor device in the comparative example. The semiconductor device in FIG. 3 differs from the semiconductor device 10 in the first embodiment in that it does not have the crystal defect region 50. Moreover, FIG. 4 shows characteristics exhibited when an IGBT in the semiconductor device in FIG. 3 is turned on. When this IGBT is to be operated, a voltage equal to or higher than a threshold value is applied to the gate electrodes 34. A channel is thereby formed in the body region 24 in the periphery of each gate insulating film 32. In this state, a collector voltage (a voltage between collector and emitter) is raised. Consequently, as shown by arrows 100 in FIG. 3, electrons flow from the emitter regions 22 into the IGBT drift region 26. At this stage, since the collector voltage is low, a pn junction at a border between the collector region 30 and the IGBT buffer region 28 is not turned on. Accordingly, as shown by arrows 102 and 104, electrons flow toward the lower electrode 16 via the cathode region 48. As shown by the arrow 102, many of the electrons flow from the IGBT drift region 26 into the IGBT buffer region 28, and then flow to the lower electrode 16 through the diode buffer region 46 and the cathode region 48. Moreover, as shown by the arrow 104, a part of the electrons flow from the IGBT drift region 26 into the diode drift region 44, and then flow to the lower electrode 16 through the diode buffer region 46 and the cathode region 48. Since a current flows in this manner, as shown in FIG. 4, a collector current gradually rises as the collector voltage rises. Moreover, as the collector current rises, a voltage applied to the pa junction at the border between the collector region 30 and the IGBT buffer region 28 also rises. Once the collector voltage reaches a voltage V1 shown in FIG. 4, the pn junction is turned on. Consequently, holes flow from the collector region 30 into the IGBT drift region 26, and owing to a conductivity modulation phenomenon, the resistance of the IGBT drift region 26 sharply decreases. Accordingly, as shown in FIG. 4, the collector voltage sharply decreases to a voltage V2. Afterwards, the collector current sharply increases as the collector voltage rises. As such, in the semiconductor device in the comparative example, when the IGBT is turned on, the collector voltage instantaneously rises to the voltage V1, which is high. That is, snapback occurs. Accordingly, the semiconductor device in the comparative example suffers large losses when the IGBT is turned on.

In contrast to this, in the semiconductor device 10 in the first embodiment shown in FIG. 1, the crystal defect region 50 is provided in the diode buffer region 46. As mentioned above, the crystal defect region 50 has a high electrical resistance. Accordingly, the flow of electrons as shown by the arrows 102 and 104 in FIG. 3 is restrained. Accordingly, in the semiconductor device 10 in the first embodiment, the snapback as shown in FIG. 4 is less likely to occur, and the losses when the IGBT is turned on are small.

Figure 5:
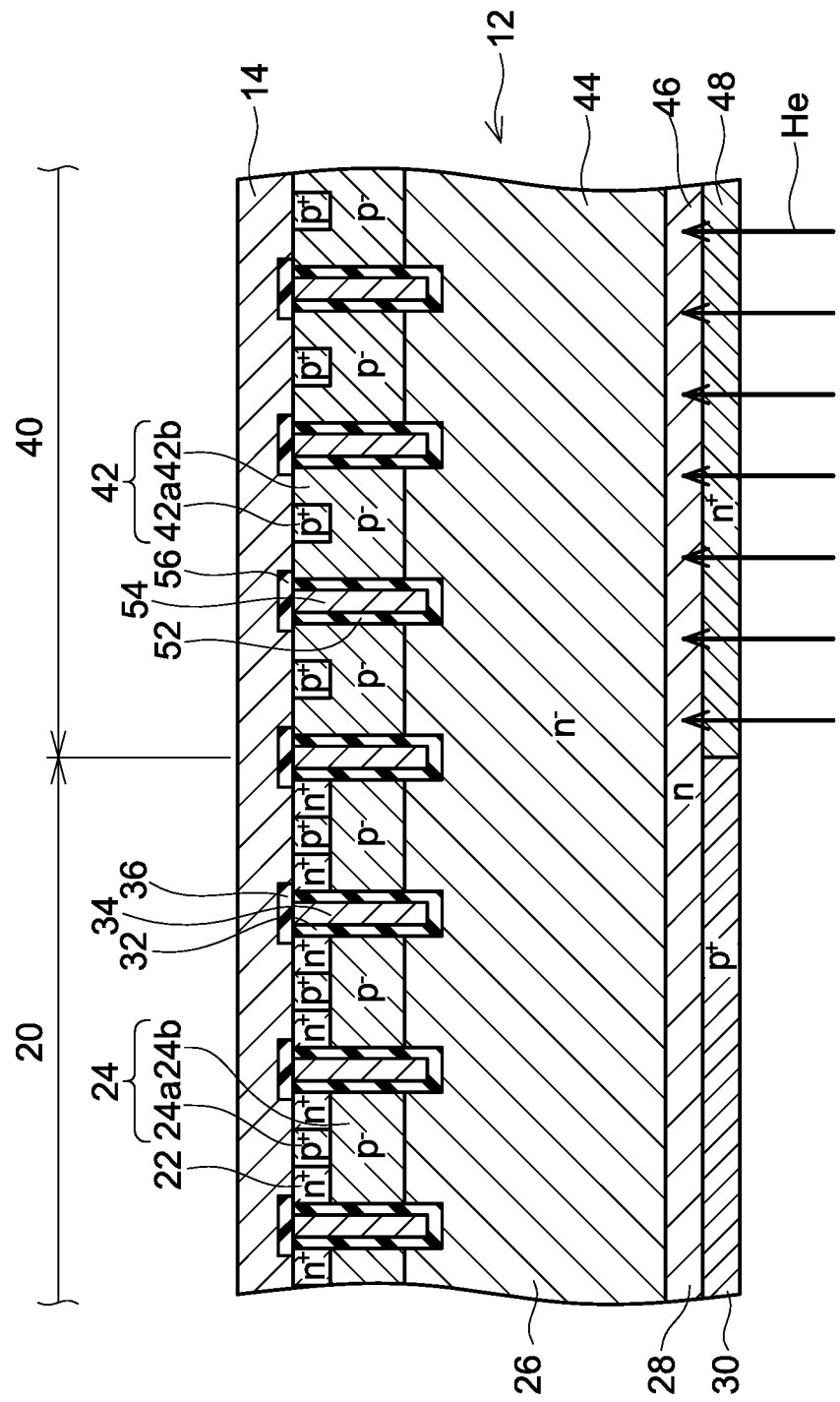
FIG. 5 is an explanatory view of a step of forming crystal defects.

Next, a method of manufacturing the semiconductor device 10 will be described. As shown in FIG. 5, firstly, configurations of the semiconductor device 10 other than the lower electrode 16 are formed by a conventionally-known method. Next, the lower surface of the semiconductor substrate 12 is irradiated with helium ions. The irradiation of helium ions is performed with the irradiation energy being adjusted so as to allow the helium ions to stop in the diode buffer region 46. The helium ions with which the lower surface of the semiconductor substrate 12 has been irradiated are implanted into the semiconductor substrate 12, and stop in the diode buffer region 46. When the helium ions stop, crystal defects are formed near the positions where the helium ions stop. Therefore, according to this method, crystal defects are (i.e., the crystal defect region 50 is) formed in the diode buffer region 46 in a high concentration. That is, the peak value C1 of the crystal defect concentration is formed in the diode buffer region 46. Afterwards, the lower electrode 16 is formed to thereby complete the semiconductor device 10. Notably, in the manufacturing method mentioned above, after respective semiconductor regions of an n-type or a p-type have been formed in the semiconductor substrate 12, helium ions are implanted. Alternatively, the implantation of helium ions may be performed before the formation of the semiconductor regions. Moreover, some of the semiconductor regions may be formed before the implantation of helium ions, and the remaining semiconductor regions may be formed after the implantation of helium ions.

Figure 6:
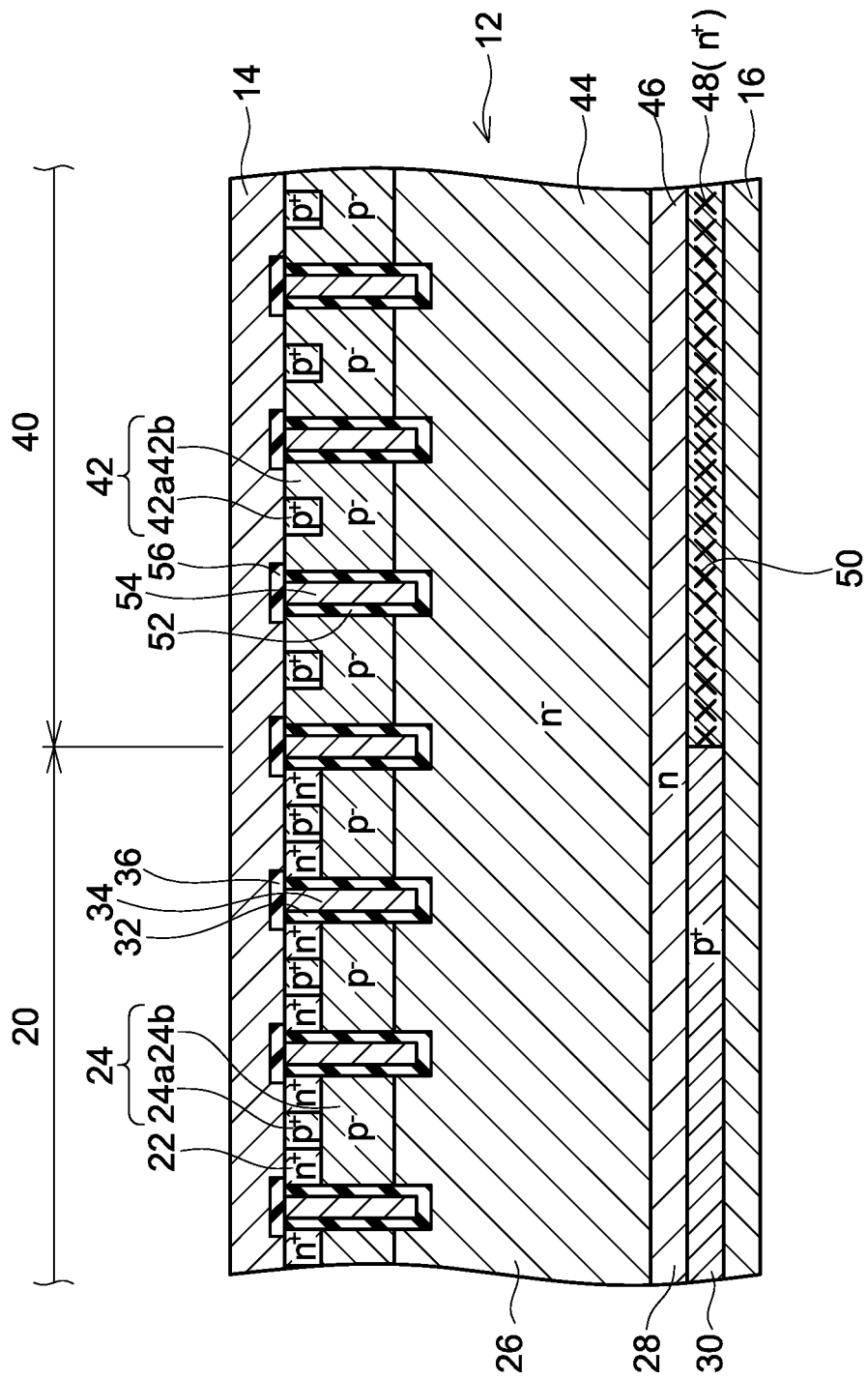
FIG. 6 is a vertical cross-sectional view of a semiconductor device in a second embodiment.
Figure 7:
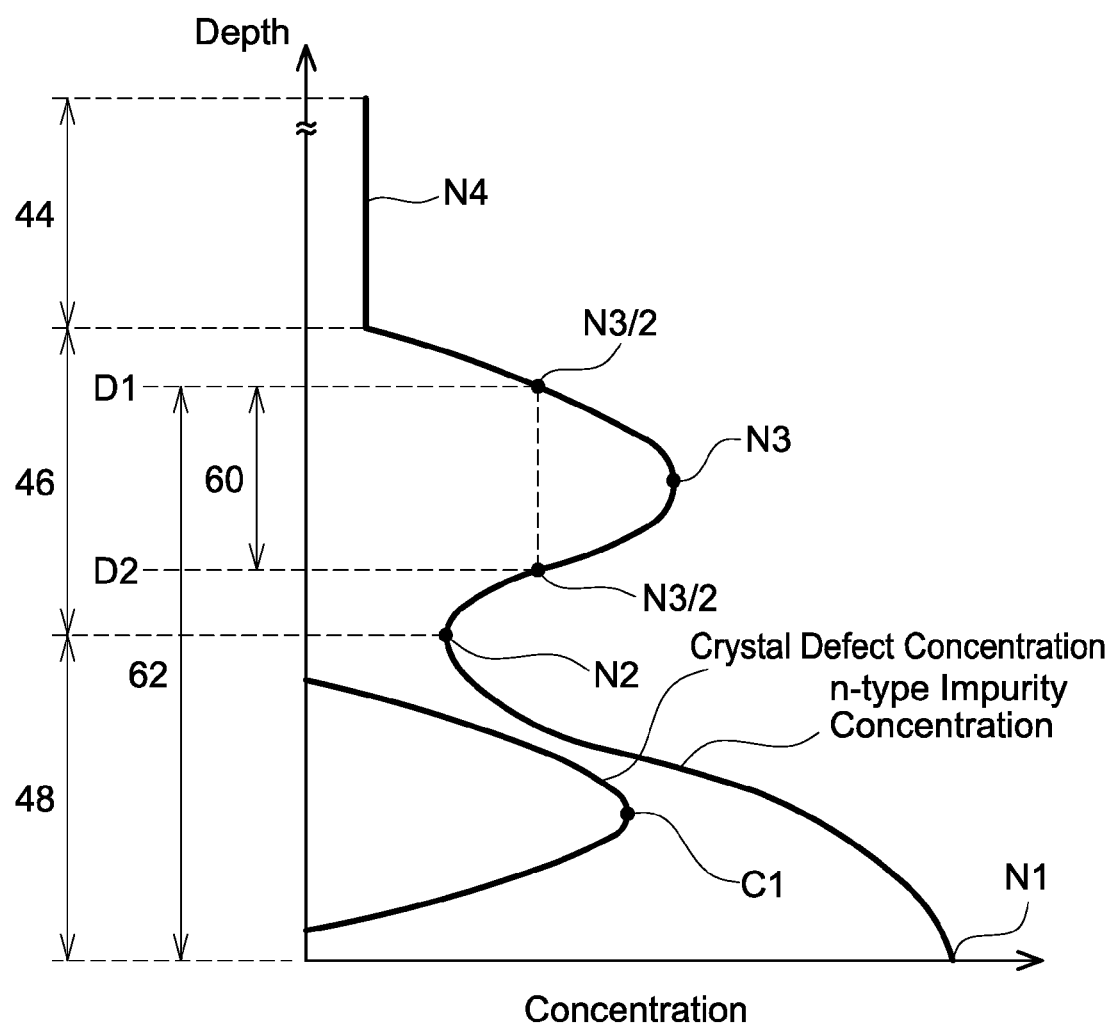
FIG. 7 is a graph that shows n-type impurity concentration distribution and crystal defect concentration distribution in a depth direction of the semiconductor device in the second embodiment.
Figure 8:
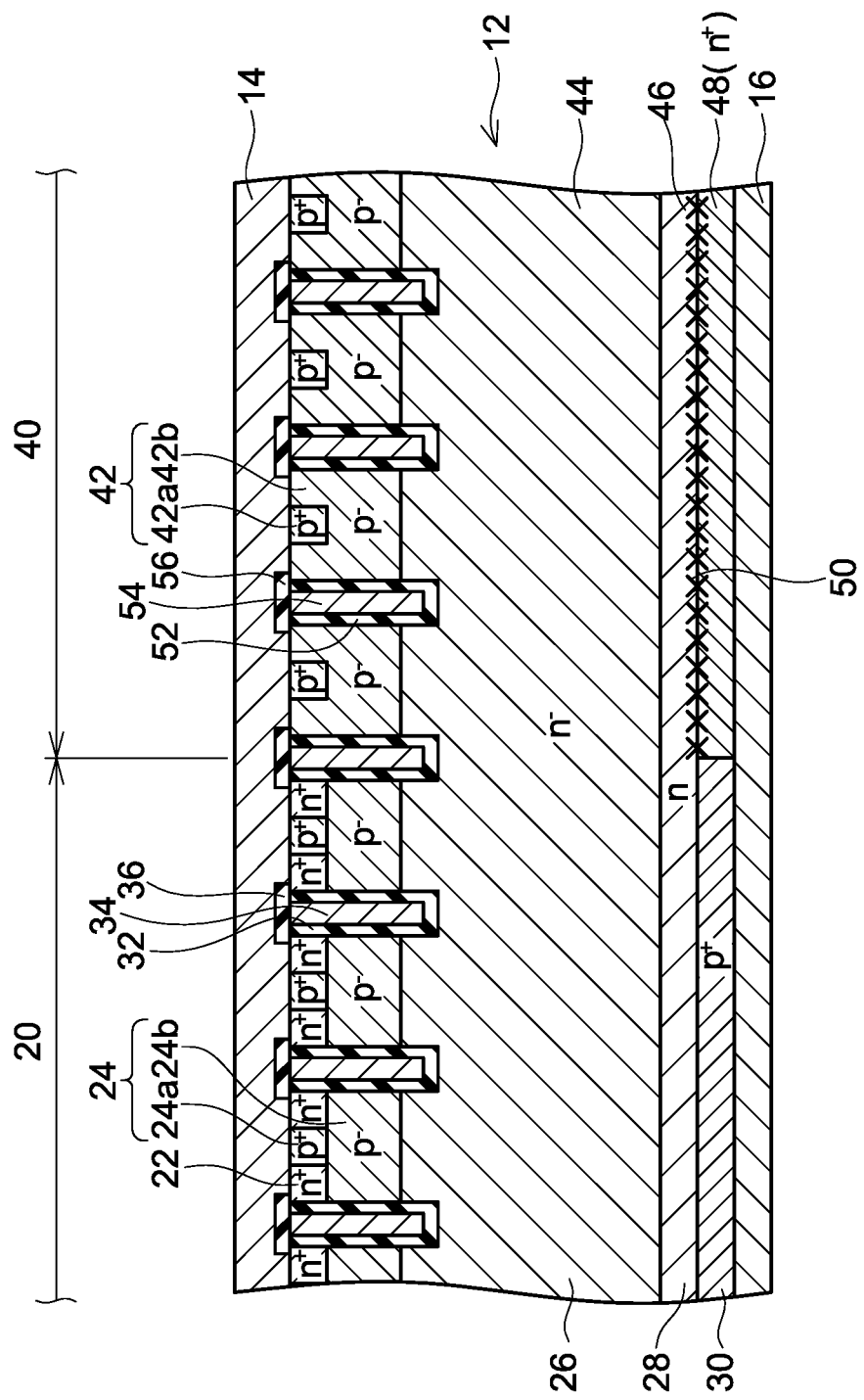
FIG. 8 is a vertical cross-sectional view of a semiconductor device in a third embodiment.
Figure 9:
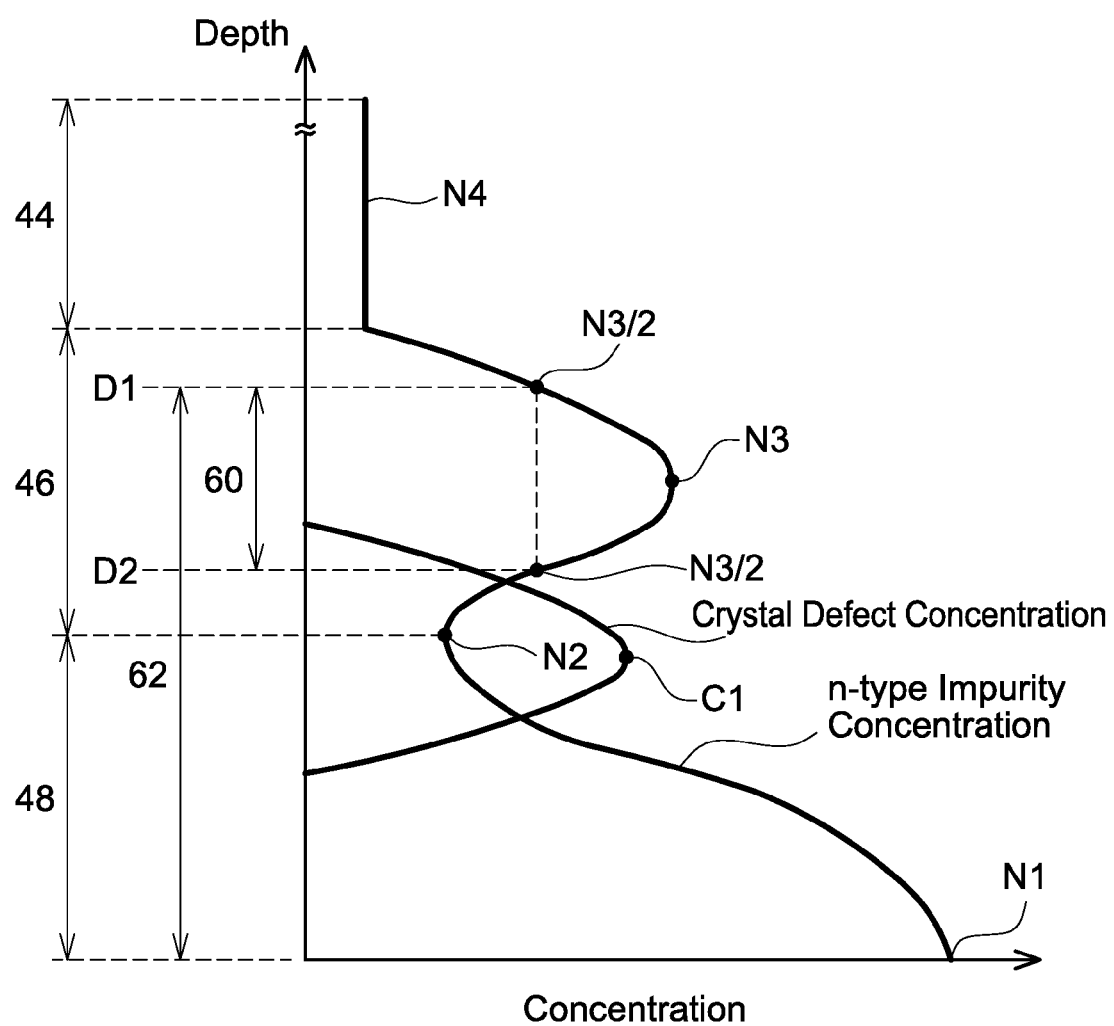
FIG. 9 is a graph that shows n-type impurity concentration distribution and crystal defect concentration distribution in a depth direction of the semiconductor device in the third embodiment.
Figure 10:
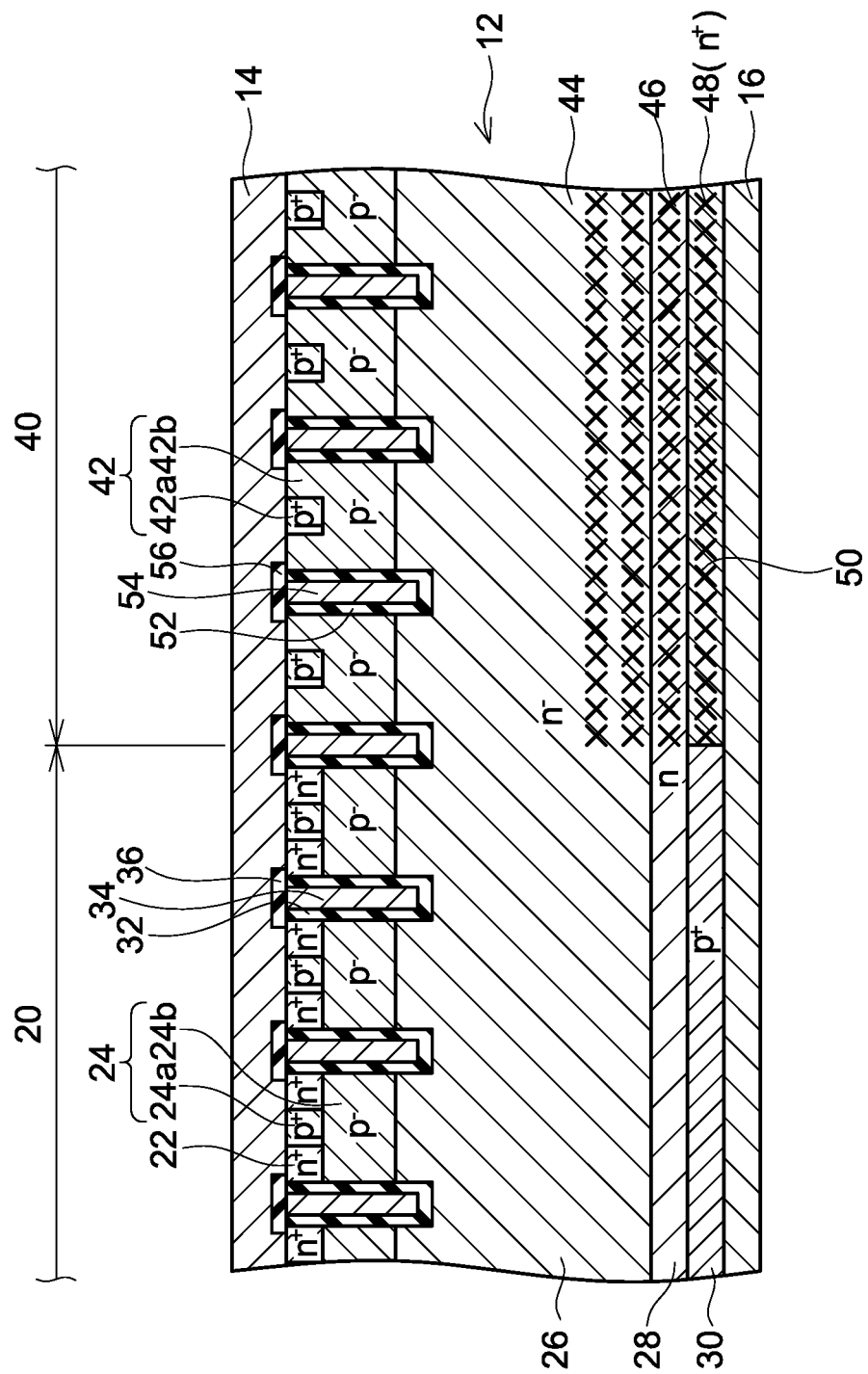
FIG. 10 is a vertical cross-sectional view of a semiconductor device in a fourth embodiment.
Figure 11:
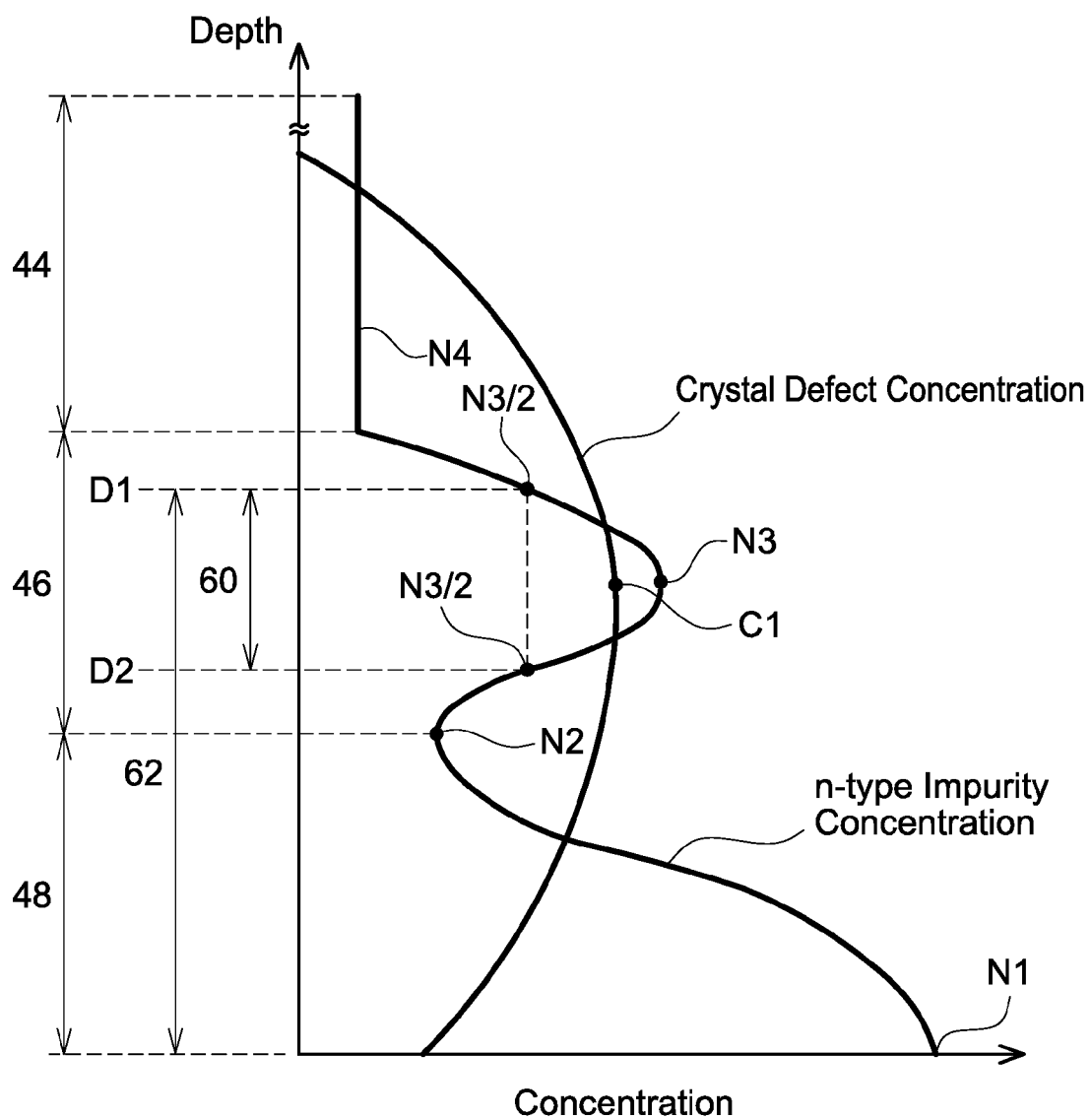
FIG. 11 is a graph that shows n-type impurity concentration distribution and crystal defect concentration distribution in a depth direction of the semiconductor device in the fourth embodiment.

Notably, in the above-mentioned first embodiment, the peak value C1 of the crystal defect concentration is located in the region 60. However, the peak value C1 of the crystal defect concentration may be at any position as long as it is located in a region 62 on the lower surface side with respect to the position D1 in FIG. 2 (i.e., the position having a half of the concentration of the local maximum value N3 and located on the upper surface side with respect to the position of the local maximum value N3). For example, as shown in FIGS. 6 and 7, the peak value C1 may be located in the cathode region 48. Moreover, as shown in FIGS. 8 and 9, the peak value C1 may be located near the depth of the local minimum value N2 (i.e., the border between the diode buffer region 46 and the cathode region 48). Even with these configurations, the current that flows as shown by the arrows 102 and 104 in FIG. 3 can be restrained by crystal defects. That is, even with these configurations, snapback can be restrained. Moreover, as shown in FIGS. 10 and 11, the crystal defect region 50 may be provided in a wide range in the depth direction of the semiconductor substrate 12. Even with such a configuration, snapback can be restrained as long as the peak value C1 is located in the region 62. It should be noted that the peak value C1 of the crystal defect concentration is preferably located in the diode buffer region 46. The n-type impurity concentration in the diode buffer region 46 is lower than the n-type impurity concentration in the cathode region 48. Accordingly, the diode buffer region 46 has an electrical resistance higher than the electrical resistance of the cathode region 48. Accordingly, only by forming a relatively small amount of crystal defects in the diode buffer region 46, it is possible to raise the electrical resistance of the diode buffer region 46 to such a degree as to restrain the flow of electrons as shown by the arrows 102 and 104. By ensuring a small amount of crystal defects to be formed as such, it is possible to restrain the rise in on-resistance of the diode due to the formation of crystal defects. Moreover, it is possible to restrain an increase in leakage current in the diode due to the formation of crystal defects. Moreover, since a small amount of crystal defects are formed, the step of forming the crystal defects can be performed in a short time, and hence the semiconductor device 10 can efficiently be manufactured. Moreover, as shown in FIG. 2, the peak value C1 of the crystal defect concentration is more preferably located in the region 60. As such, when the peak value C1 of the crystal defect concentration is provided in the region 60 in the diode buffer region 46, the region 60 having a high n-type impurity concentration, even if the position of the peak value C1 is somewhat changed in the region 60, the effect of restraining snapback does not differ so much. Accordingly, characteristics of the semiconductor device 10 are kept stable in mass production of semiconductor devices.

Figure 12:
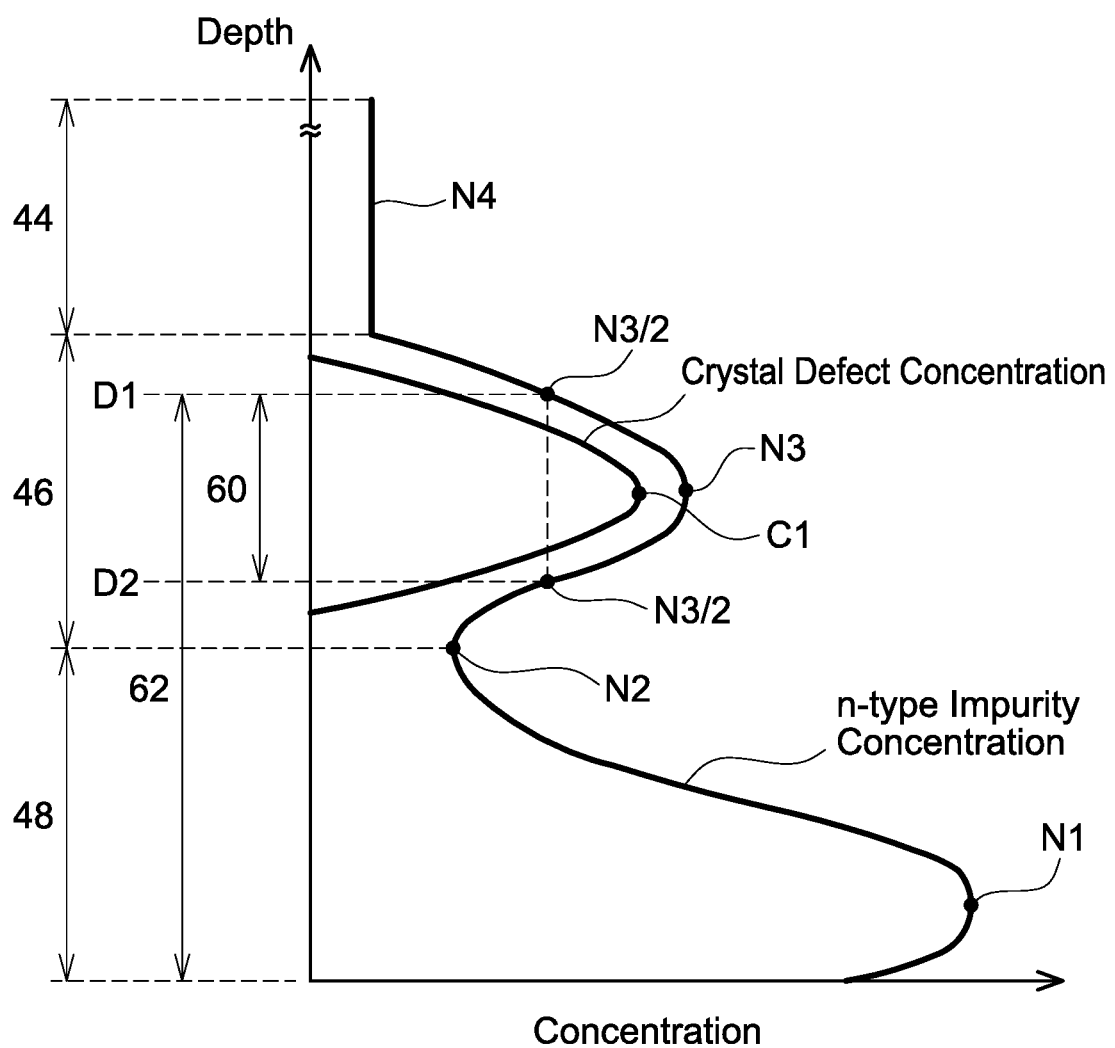
FIG. 12 is a graph that shows n-type impurity concentration distribution and crystal defect concentration distribution in a depth direction of a semiconductor device in a fifth embodiment.

Moreover, in each of the embodiments mentioned above, the peak value N of the n-type impurity concentration in the cathode region 48 is located at the position of the lower surface of the semiconductor substrate 12 as shown in FIG. 2. However, as shown in FIG. 12, the peak value N1 may be located at a position inside the cathode region 48.

Moreover, in the semiconductor device in each of the embodiments mentioned above, the IGBT buffer region 28 is provided. However, the IGBT buffer region 28 may not be provided. That is, the collector region 30 may be in contact with the IGBT drift region 26.

Moreover, in each of the embodiments mentioned above, the single upper electrode 14 functions as the emitter electrode of the IGBT and the anode electrode of the diode. However, the emitter electrode of the IGBT and the anode electrode of the diode that are separated from each other may be provided on the upper surface of the semiconductor substrate 12.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A semiconductor device comprising:
    a semiconductor substrate comprising an IGBT region and a diode region,
    an emitter electrode provided on a front surface of the semiconductor substrate in the IGBT region;
    an anode electrode provided on the front surface of the semiconductor substrate in the diode region; and
    a rear electrode provided on a rear surface of the semiconductor substrate, wherein
the IGBT region comprises:
an emitter region of an n-type and in contact with the emitter electrode;
a body region of a p-type and in contact with the emitter electrode;
an IGBT drift region of the n-type and separated from the emitter region by the body region;
a collector region of the p-type, separated from the body region by the IGBT drift region, and in contact with the rear electrode;
a gate insulating film in contact with the body region; and
a gate electrode facing the body region via the gate insulating film,
the diode region comprises:
an anode region of the p-type and in contact with the anode electrode;
a diode drift region of the n-type, bordering the anode region on a rear surface side, and connected to the IGBT drift region;
a buffer region of the n-type and bordering the diode drift region on the rear surface side; and
a cathode region of the n-type, bordering the buffer region on the rear surface side, and in contact with the rear electrode,
in a view of n-type impurity concentration distribution along a direction from the front surface to the rear surface, a local minimum value of an n-type impurity concentration is located at a border between the cathode region and the buffer region, and a local maximum value of the n-type impurity concentration is located in the buffer region,
a peak value of the n-type impurity concentration in the cathode region and the local maximum value are higher than the n-type impurity concentration in the diode drift region,
at least one of the buffer region and the cathode region comprises a crystal defect region in which crystal defects are distributed in a higher concentration than a region around the crystal defect region, and
a peak value of a crystal defect concentration in the view of crystal defect concentration distribution along the direction from the front surface to the rear surface is located in a region on the rear surface side with respect to a specific position having the n-type impurity concentration which is a half of the local maximum value, the specific position being located on a front surface side with respect to a position of the local maximum value.

2. The semiconductor device of claim 1, wherein the peak value of the crystal defect concentration is located in the buffer region.

3. The semiconductor device of claim 2, wherein the peak value of the crystal defect concentration is located in a region having the n-type impurity concentration which is higher than a half of the local maximum value.

4. A method of manufacturing the semiconductor device of claim 1, the method comprising a step of implanting charged particles into the semiconductor substrate so as to form the crystal defect region.

* * * * *